(12) United States Patent
Shen et al.

(10) Patent No.: US 8,247,833 B2
(45) Date of Patent: Aug. 21, 2012

(54) LED PACKAGE AND MANUFACTURING METHOD THEREOF

(75) Inventors: Chia-Hui Shen, Hsinchu Hsien (TW); Tzu-chien Hung, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 12/951,084

(22) Filed: Nov. 22, 2010

(65) Prior Publication Data
US 2011/0266586 A1 Nov. 3, 2011

(30) Foreign Application Priority Data

Apr. 29, 2010 (CN) .......................... 2010 1 0160009

(51) Int. Cl.
*H01L 33/00* (2010.01)
*H01L 21/00* (2006.01)
(52) U.S. Cl. ............ 257/98; 257/99; 257/432; 257/778; 257/E25.032; 438/25; 438/27; 438/29; 438/462

(58) Field of Classification Search ..................... None
See application file for complete search history.

(56) References Cited

U.S. PATENT DOCUMENTS

| 6,480,389 B1 * | 11/2002 | Shie et al. ..................... 361/707 |
| 7,495,322 B2 * | 2/2009 | Hashimoto et al. ........... 257/676 |
| 2004/0065894 A1 * | 4/2004 | Hashimoto et al. ........... 257/100 |
| 2009/0166664 A1 * | 7/2009 | Park et al. ........................ 257/99 |
| 2009/0200572 A1 * | 8/2009 | Kamamori et al. ........... 257/100 |
| 2010/0159621 A1 * | 6/2010 | Kimura et al. .................. 438/27 |

* cited by examiner

*Primary Examiner* — Alonzo Chambliss
(74) *Attorney, Agent, or Firm* — Altis Law Group, Inc.

(57) ABSTRACT

An LED package includes a base, an LED chip, and an encapsulant. The LED chip is mounted on the base, and is enclosed by the encapsulant. The base includes a substrate and a blocking wall integrally formed with the substrate. The blocking wall divides a surface of the substrate into a first bonding area and a second bonding area. An electrically conductive layer and a solder are formed on the bonding area in sequence. The blocking wall can block the first and second solder to overflow outside the first and second bonding area at soldering respectively. A method for manufacturing the LED package is also provided.

8 Claims, 6 Drawing Sheets

LED PACKAGE AND MANUFACTURING METHOD THEREOF

BACKGROUND

1. Technical Field

The present disclosure generally relates to LED technology, and particularly to an LED package.

2. Description of the Related Art

Light emitting diodes' (LEDs') many advantages, such as high luminosity, low operational voltage, low power consumption, compatibility with integrated circuits, easy driving, long-term reliability, and environmental friendliness, have promoted the LEDs as a widely used light source. Light emitting diodes are commonly applied in lighting applications.

LED packages must, however, overcome manufacturing challenges. Referring to FIG. 1, a schematic cross section of a base of a commonly used LED package is shown. The base includes a substrate 11, and a first conductive layer 12a and a second conductive layer 12b formed at interval on the substrate 11. A first carrier 13a and a second carrier 13b are defined respectively on the first conductive layer 12a and the second conductive layer 12b. A first solder 14a and a second solder 14b are defined on the first carrier 13a and the second carrier 13b. Two first blocking walls 15a, 15a' and two second blocking walls 15b, 15b' are respectively formed on the first conductive layer 12a and the second conductive layer 12b on two sides of the first solder 14a and the second solder 14b. It is complicated to form blocking walls on the conductive layer to prevent solder from overflow, and manufacturing costs are increased.

What is needed, therefore, is an LED package which can improve manufacturing convenience, and ameliorate the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the LED package. Moreover, in the drawings, like reference numerals designate corresponding parts throughout the views.

DETAILED DESCRIPTION

Embodiments of an LED package as disclosed are described in detail here with reference to the drawings.

Figure 1:
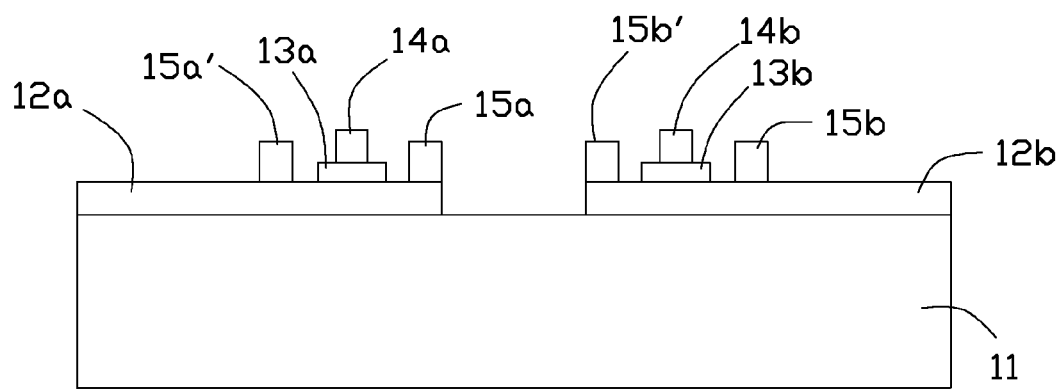
FIG. 1 is a schematic cross section of a base of a commonly used LED package.
Figure 2:
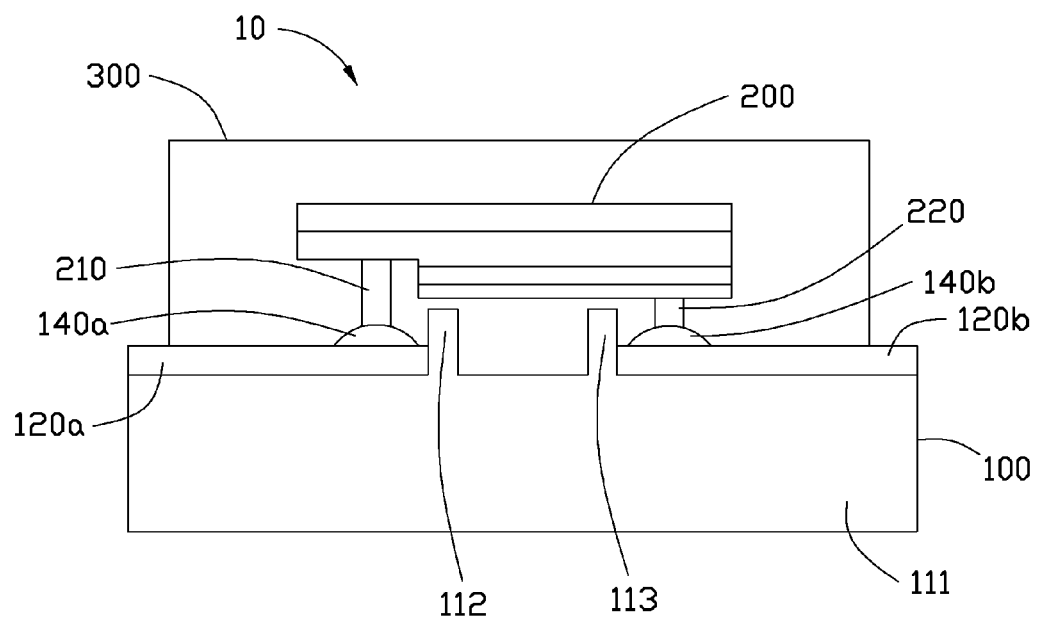
FIG. 2 is a schematic cross section of an LED package in accordance with a first embodiment.
Figure 3:
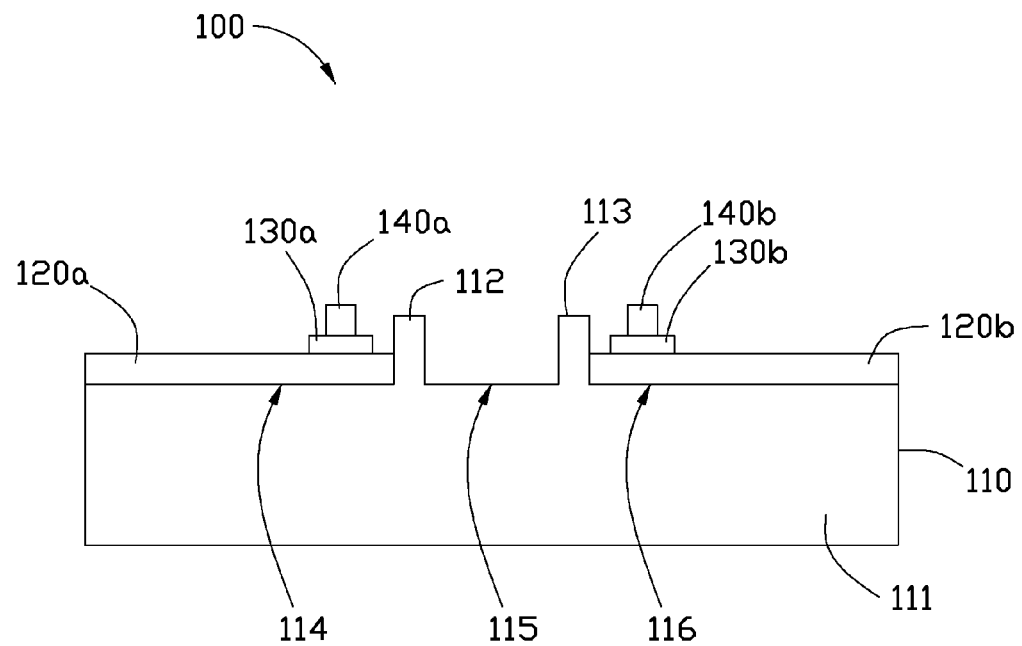
FIG. 3 is a schematic cross section of a base of an LED package in accordance with a first embodiment.

Referring to FIG. 2 and FIG. 3, an LED package 10 in accordance with a first embodiment includes a base 100, an LED chip 200, and an encapsulant 300. The base 100 includes a substrate 110, a first conductive layer 120a, a second conductive layer 120b, a first carrier 130a, a second carrier 130b, a first solder 140a, and a second solder 140b. The LED chip 200 is a flip chip.

The substrate 110 includes a substrate body 111, and a first blocking wall 112 and a second blocking wall 113 protruding upwardly from a top surface of the substrate body 111. In this embodiment, the first blocking wall 112 and the second blocking wall 113 are parallel and can be arranged in different ways, such as with intersecting extension lines. In this embodiment, the first blocking wall 112 and the second blocking wall 113 are perpendicular to the top surface of the substrate body 111 but are not limited thereto.

The first blocking wall 112 and the second blocking wall 113 are formed integrally with and divide the surface of the substrate body 111 into a first bonding area 114, a spacing region 115, and a second bonding area 116. The spacing region 115 is arranged between the first bonding area 114 and the second bonding area 116. The substrate 110 can be ceramic, silicon, or PCB (printed circuit board). The first blocking wall 112 and the second blocking wall 113 are formed by etching in this embodiment.

The first conductive layer 120a and the second conductive layer 120b are formed on the first bonding area 114 and the second bonding area 116 of the substrate 110 by vapor deposition. The first conductive layer 120a and the second conductive layer 120b can be gold, silver, copper, nickel, aluminum, or an alloy of combination thereof.

The first carrier 130a and the second carrier 130b are formed respectively on the first conductive layer 120a and the second conductive layer 120b near the first blocking wall 112 and the second blocking wall 113 for seating the first solder 140a and the second solder 140b. The first carrier 130a and the second carrier 130b respectively electrically connect with the first conductive layer 120a and the second conductive layer 120b. The first carrier 130a and the second carrier 130b can be gold, platinum, chromium, or titanium.

The first solder 140a and the second solder 140b are configured for electrically connecting the LED chip 200 with the first conductive layer 120a and the second conductive layer 120b. In this embodiment, the bottom area of the first solder 140a and the second solder 140b are respectively less than the carrying area of the first carrier 130a and the second carrier 130b.

The LED chip 200 is flipped to contact the base 100 with the first electrode 210 and the second electrode 220. The first electrode 210 electrically connects with the first conductive layer 120a through the first solder 140a, and the second electrode 220 electrically connects with the second conductive layer 120b through the second solder 140b.

The encapsulant 300 is an encapsulating resin covering the LED chip 200 and providing protection from dust and moisture. Preferably, the encapsulant 300 can include phosphor, such as Yttrium aluminum garnet (YAG, $Y_3Al_5O_{12}$), Terbium aluminum garnet (TAG, $Tb_3Al_5O_{12}$), silicate, or combination thereof, to increase utility of light.

During soldering of the first solder 140a and the second solder 140b with high temperature to connect with the first electrode 210 and the second electrode 220, the first blocking wall 112 and the second blocking wall 113 on the base 100 can prevent the first solder 140a and the second solder 140b from overflowing and short circuiting the first conductive layer 120a and the second conductive layer 120b. The substrate 100 can be a printed circuit board (PCB), by forming an integral blocking wall.

Figure 4:
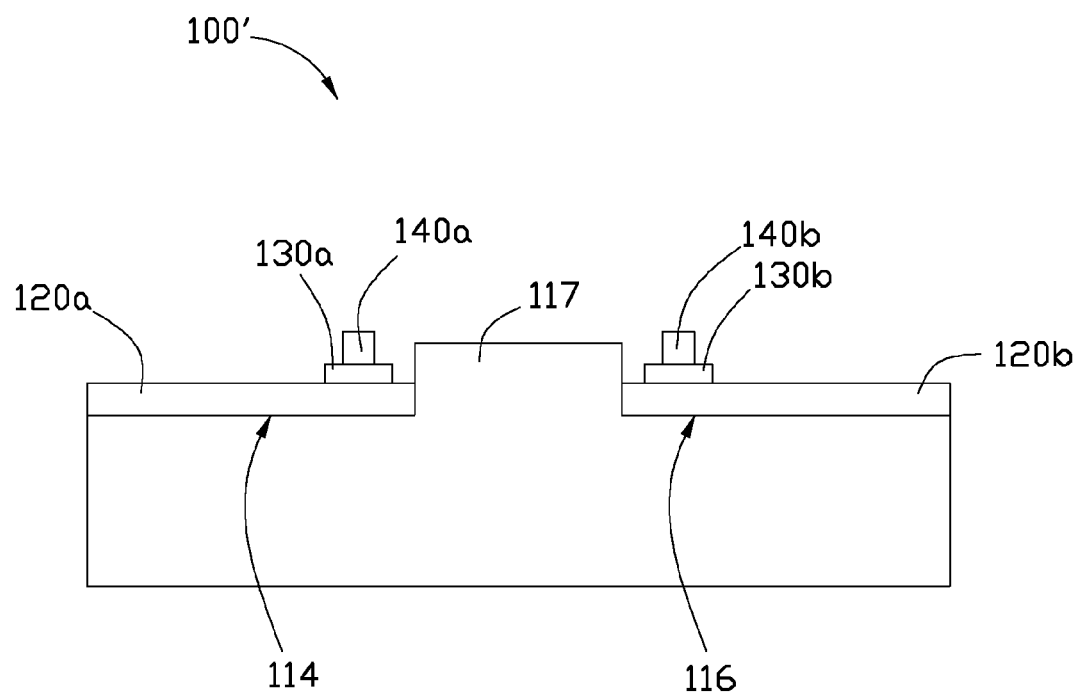
FIG. 4 is a schematic cross section of a base of an LED package in accordance with a second embodiment.

Referring to FIG. 4, an LED package 10 in accordance with a second embodiment differs from the first embodiment in that the base 100' of the second embodiment includes only one blocking wall 117 formed integrally to separate the first bonding area 114 and the second bonding area 116. The first conductive layer 120a, the first carrier 130a, the first solder 140a, and the second conductive layer 120b, the second carrier 130b, the second solder 140b are respectively configured on the first bonding area 114 and the second bonding area 116. The blocking wall 117 can prevent the first solder 140a and the second solder 140b from solder overflow.

Figure 5:
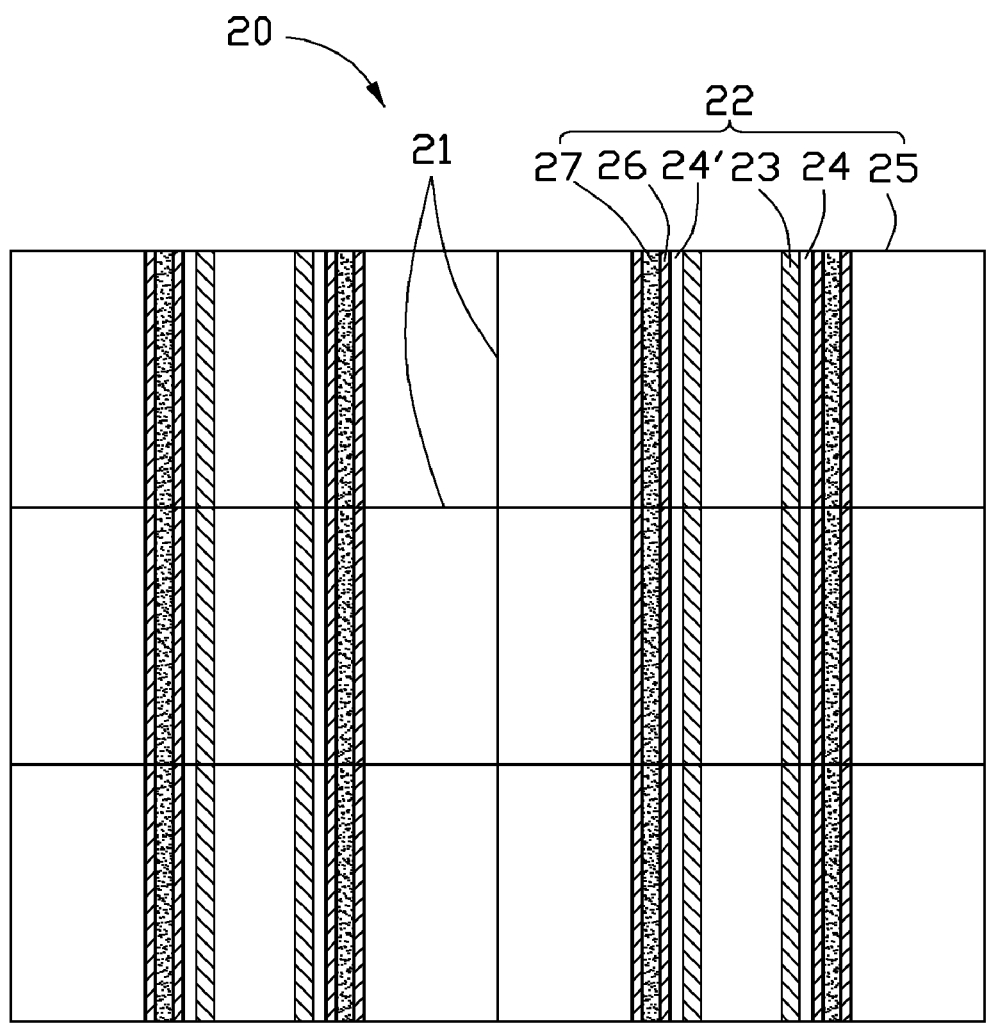
FIG. 5 is a schematic view of a substrate plate of an LED package in accordance with a first embodiment.
Figure 6:
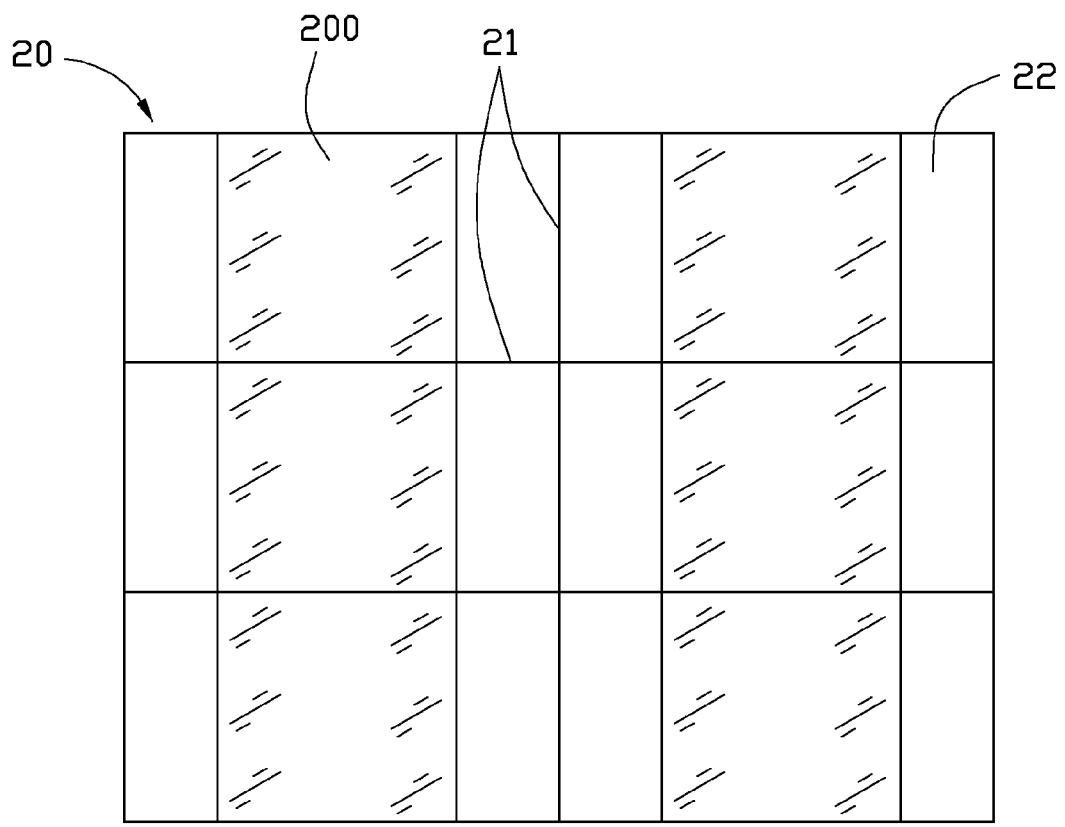
FIG. 6 is a schematic view of a substrate plate of an LED package of FIG. 5 after flipping LED chips.

Referring to FIG. 5 and FIG. 6, a manufacturing method of an LED package is as follows:

Step 1, provide a substrate 20 and etch a plurality of cutting lanes 21 on the substrate 20 according to a predetermined pattern. The cutting lanes 21 divide the substrate 20 into a plurality of substrate units 22. The substrate 20 can be ceramic, silicon, or PCB.

Step 2, etch to form a blocking wall 23 on each substrate unit 22 for separating the substrate unit 22 into a first bonding area 24 and a second bonding area 24'. In this embodiment, a pair of parallel blocking walls 23 is formed on each substrate unit 22.

Step 3, form conductive layers 25 respectively on the first bonding area 24 and the second bonding area 24'. In this embodiment, the conductive layer 25 can be gold, silver, copper, nickel, aluminum, or combination thereof.

Step 4, form carriers 26 on a predetermined position of the conductive layer 25. The carrier 26 can be gold, platinum, chromium, or titanium.

Step 5, form solders 27 on the carriers 26. The area of the solder 27 does not exceed the area of the carrier 26.

Step 6, flip an LED chip 200 on each substrate unit 22.

Step 7, encapsulate the LED chip 200. The encapsulant can include phosphor to generate light of different colors.

Step 8, cut along the cutting lane 21 to achieve a plurality of LED packages.

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED package comprising a base, an LED chip, and an encapsulant, wherein the LED chip is mounted on the base and enclosed by the encapsulant, the base includes a substrate and at least one blocking wall integrally formed with the substrate and protruding upwardly from the substrate, and the at least one blocking wall divides a surface of the substrate into a first bonding area and a second bonding area, a first conductive layer being provided on the first bonding area, a second conductive layer being provided on the second bonding area, the LED chip being a flip chip and located over the surface of the substrate and the at least one blocking wall and forming a flip chip connection with the substrate, the LED chip comprising a first electrode electrically connecting with the first conductive layer and a second electrode electrically connecting with the second conductive layer, wherein the first electrode and the second electrode of the LED chip are positioned at two opposite lateral sides of the at least one blocking wall, respectively.

2. The LED package of claim 1, wherein the at least one blocking wall is made by etching.

3. The LED package of claim 1, wherein the at least one blocking wall comprises a first blocking wall and a second blocking wall, and a spacing region is between the two blocking walls.

4. The LED package of claim 1, wherein the substrate is ceramic, silicon, or PCB.

5. The LED package of claim 1, wherein a first solder is formed on the first conductive layer, a second solder is formed on the second conductive layer, and the conductive layers are made of gold, silver, copper, nickel, aluminum, or an alloy of combination thereof, the first solder being soldered to the first electrode of the LED chip and the second solder being soldered to the second electrode of the LED chip.

6. The LED package of claim 1, wherein a first carrier and a second carrier are defined respectively on the first conductive layer and the second conductive layer, and the first solder and the second solder are respectively on the first carrier and the second carrier.

7. The LED package of claim 6, wherein the first carrier and the second carrier are made of gold, platinum, chromium, or titanium.

8. A manufacturing method of an LED package comprising:
   providing a substrate and etching a plurality of cutting lanes to form a plurality of substrate units;
   etching each substrate unit to form a blocking wall for dividing the substrate unit into a first bonding area and a second bonding area, the blocking wall protruding upwardly from the substrate unit;
   defining a conductive layer respectively on the first and second bonding area;
   defining a carrier on the conductive layer;
   defining a solder on the carrier;
   flipping an LED chip respectively on each substrate unit to make the LED chip soldered to the solders, the LED chip being a flip chip, located over the blocking wall and having a first electrode and a second electrode, the first electrode and the second electrode of the LED chip being positioned at two opposite lateral sides of the blocking wall, respectively;
   encapsulating the LED chip; and
   cutting through the cutting lane.

\* \* \* \* \*